(12) United States Patent
Machida

(10) Patent No.: US 10,347,573 B2
(45) Date of Patent: Jul. 9, 2019

(54) SEMICONDUCTOR DEVICE AND WIRING BOARD DESIGN METHOD

(71) Applicant: LAPIS SEMICONDUCTOR CO., LTD., Kanagawa (JP)

(72) Inventor: Hideaki Machida, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/782,365

(22) Filed: Oct. 12, 2017

(65) Prior Publication Data

US 2018/0108603 A1 Apr. 19, 2018

(30) Foreign Application Priority Data

Oct. 17, 2016 (JP) .................................. 2016-203694

(51) Int. Cl.
*H01L 23/498* (2006.01)
*G06F 17/50* (2006.01)
(Continued)

(52) U.S. Cl.
CPC .... *H01L 23/49816* (2013.01); *G06F 17/5072* (2013.01); *G06F 17/5077* (2013.01); *H01L 23/562* (2013.01); *H01L 25/18* (2013.01); *H01L 23/3128* (2013.01); *H01L 24/29* (2013.01); *H01L 24/32* (2013.01); *H01L 24/48* (2013.01); *H01L 24/49* (2013.01); *H01L 24/73* (2013.01); *H01L 24/83* (2013.01); *H01L 25/0655* (2013.01); *H01L 2224/29339* (2013.01);
(Continued)

(58) Field of Classification Search
CPC ......... H01L 23/49816; H01L 23/49822; H01L 2924/35–3512; H01L 21/56; H01L 23/12; G06F 17/5068–5077
See application file for complete search history.

(56) References Cited

U.S. PATENT DOCUMENTS

| 5,294,750 A * | 3/1994 | Sakai ...................... H01L 23/15 174/548 |
| 5,763,947 A * | 6/1998 | Bartley ............. H01L 23/49816 257/691 |
| 6,255,599 B1 * | 7/2001 | Chang ................... H01L 21/563 174/255 |
| 2004/0099958 A1 * | 5/2004 | Schildgen ......... H01L 23/49822 257/778 |

(Continued)

FOREIGN PATENT DOCUMENTS

| JP | 2002164385 A | 6/2002 |
| JP | 2006140512 A | 6/2006 |
| JP | 2011192678 A | 9/2011 |

*Primary Examiner* — Syed I Gheyas
(74) *Attorney, Agent, or Firm* — Volentine, Whitt & Francos, PLLC

(57) ABSTRACT

A semiconductor device includes a semiconductor chip; a substrate including a first region where the semiconductor chip is mounted and a second region separated from the first region; a conductive member provided at a second face of the substrate, the second face of the substrate is a face opposite to a first face to which the semiconductor chip is mounted; a protecting member, provided at the second face of the substrate to cover the conductive member, and including an opening partially exposing a portion of the conductive member placed at the second region; and an external connection terminal connected to the conductive member through the opening. The protecting member contacts the substrate at a portion corresponding to an outer edge of the first region.

7 Claims, 8 Drawing Sheets

(51) Int. Cl.
*H01L 23/00* (2006.01)
*H01L 25/18* (2006.01)
H01L 25/065 (2006.01)
H01L 23/31 (2006.01)

(52) U.S. Cl.
CPC ............... *H01L 2224/32225* (2013.01); *H01L 2224/48091* (2013.01); *H01L 2224/48227* (2013.01); *H01L 2224/48465* (2013.01); *H01L 2224/73265* (2013.01); *H01L 2224/83851* (2013.01); *H01L 2924/00014* (2013.01); *H01L 2924/15192* (2013.01); *H01L 2924/15311* (2013.01); *H01L 2924/181* (2013.01); *H01L 2924/35* (2013.01); *H01L 2924/3511* (2013.01)

(56) References Cited

U.S. PATENT DOCUMENTS

| | | | | |
|---|---|---|---|---|
| 2007/0158855 | A1* | 7/2007 | Minamio | H01L 23/3142 257/778 |
| 2009/0107703 | A1* | 4/2009 | Abe | H01L 23/49822 174/254 |
| 2010/0044880 | A1* | 2/2010 | Aokura | H01L 23/13 257/777 |
| 2014/0054773 | A1* | 2/2014 | Kurashima | H01L 21/565 257/738 |
| 2015/0162312 | A1* | 6/2015 | Shimizu | H05K 3/3463 257/712 |
| 2016/0111380 | A1* | 4/2016 | Sundaram | H01L 23/562 257/774 |
| 2016/0174365 | A1* | 6/2016 | Lin | H01L 23/49822 174/251 |

* cited by examiner

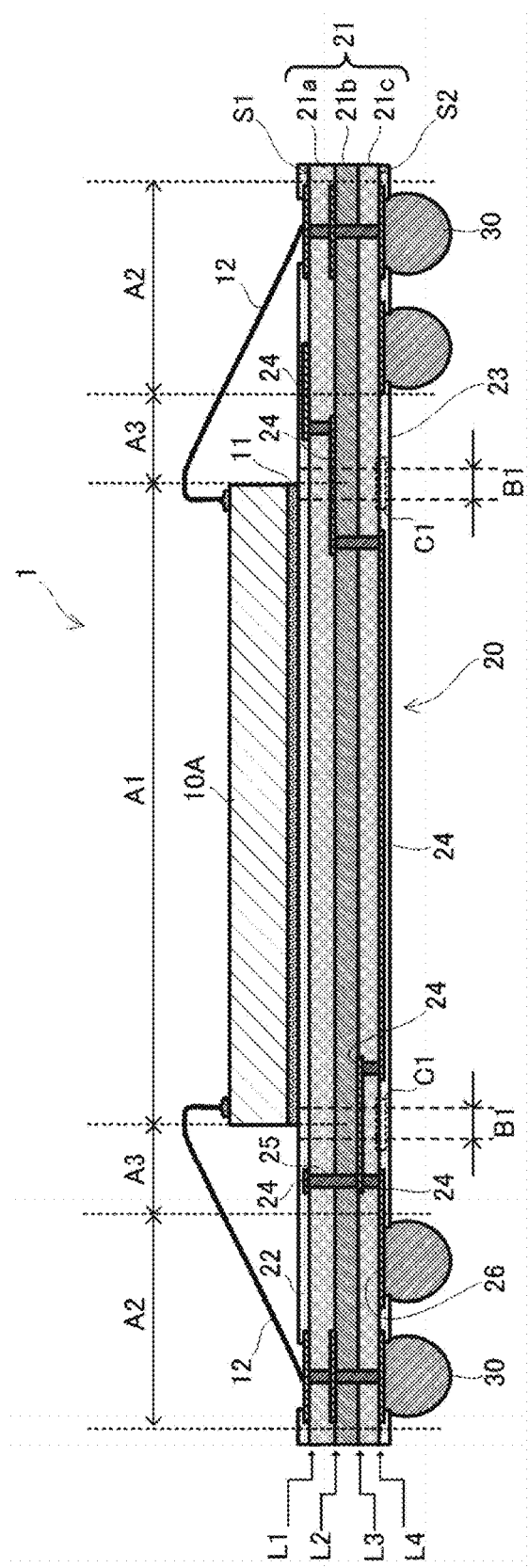

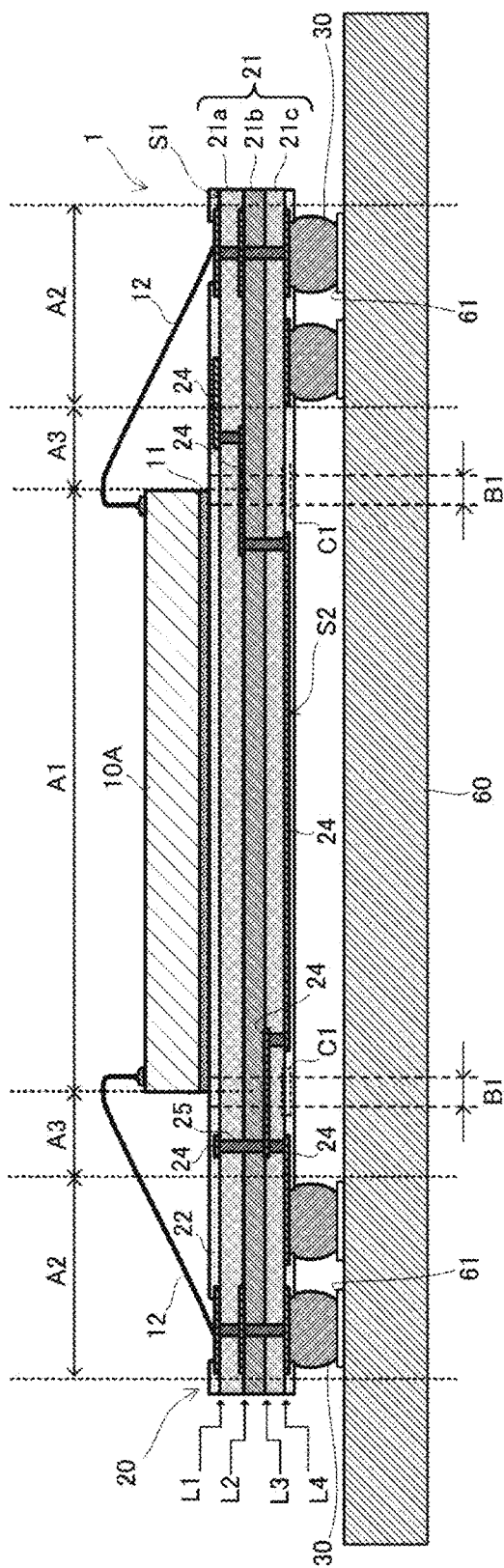

SEMICONDUCTOR DEVICE AND WIRING BOARD DESIGN METHOD

CROSS-REFERENCE TO RELATED APPLICATION

This application claims priority under 35 USC 119 from Japanese Patent Application No. 2016-203694, filed on Oct. 17, 2016, the disclosure of which is incorporated by reference herein.

BACKGROUND

Technical Field

The present disclosure relates to a semiconductor device and a wiring board design method.

Related Art

In a semiconductor device configured including a semiconductor chip and a wiring board to which the semiconductor chip is mounted, the following technology is known as technology related to preventing disconnections in wiring provided to the wiring board.

For example, Japanese Patent Application Laid-Open (JP-A) No. 2002-164385 discloses providing wiring of a mounting board to a position far from the surface of the mounting board, in a portion corresponding to an end portion of a reinforcing resin layer provided between a semiconductor chip and the mounting board.

JP-A No. 2006-140512 discloses a semiconductor device including an insulating substrate having one main face to which wiring configuring a portion of a wiring structure is provided, and a semiconductor chip mounted to the one main face of the insulating substrate through a solder resist layer. In this semiconductor device, a break preventing region that prevents disconnections in wiring portions present within the region is set below an outer edge of the semiconductor chip, so as to run along the outer edge, and a wiring portion of a wiring structure present in the break preventing region is provided so as to route around to another main face side of the insulating substrate and to separate from the solder resist layer.

JP-A No. 2011-192678 discloses an electronic device including a board, an electronic component mounted to one face of the board, and wiring formed on the board and formed so as to cross from the inside to the outside of an outer edge of the electronic component in plan view. In this electronic device, the wiring includes a portion having a wiring path that crosses the outer edge of the electronic component, that runs along the outer edge from a first place on the outer edge of the electronic component, and that extends to a second place on the outer edge of the electronic device. Further, in this electronic device, configuration is made such that the distance between the first place and the second place is wider than the wiring width of the wiring.

Configurations for semiconductor devices including a semiconductor chip and a wiring board mounted to the semiconductor chip are disclosed in JP-A No. 2002-164385 and JP-A No. 2006-140512. Namely, in these types of semiconductor device, a semiconductor chip is mounted to one face of a wiring board, external connection terminals such as solder bumps are provided to another face of the wiring board, and a placement region of the solder bumps partially overlaps with the mounting region of the semiconductor chip. Thus, due to the placement region of solder bumps partially overlapping with the mounting region of the semiconductor chip, and the wiring board is supported over the entire region by at least one out of the semiconductor chip or the solder bumps. This suppresses deflection (bending) of the wiring board from occurring as a result of differences in thermal expansion coefficients of each member configuring the semiconductor device, even when thermal stress is applied to the wiring board, and this conceivably makes disconnections in wiring resulting from deflection of the wiring board less liable to occur.

On the other hand, recently, semiconductor devices are increasingly becoming multifunctional, and a semiconductor device in which plural semiconductor chips are mounted to a surface of the wiring board has been realized. In semiconductor devices in which plural semiconductor chips are mounted to the surface of a wiring board, plural semiconductor chips are stacked onto the wiring board in products that demand small mounting surface areas, and plural semiconductor chips are arranged on the wiring board in products that demand thin forms. In a configuration in which plural semiconductor chips are arranged on the wiring board, due to the surface area of the wiring board being comparatively large, in some cases, the mounting regions of the semiconductor chip and the placement region of the solder bumps do not overlap with each other. In such cases, a free region in which the wiring board is supported by neither semiconductor chips nor solder bumps, occurs.

In a case in which thermal stress is applied to a semiconductor device provided with a wiring board having a free region supported by neither semiconductor chips nor solder bumps, deflection occurs in the wiring board originating from the free region. Further, stress occurring in the wiring board as a result of the deflection is concentrated in a region directly below the outer edge of the semiconductor chip, and this concentration of the stress becomes especially great on a second face at the opposite side to a first face where the semiconductor chips of the wiring board are mounted (namely, the face at the side where the solder bumps are provided). Further, there is a high risk of disconnection occurring at a portion of wiring provided on the second face of the wiring board corresponding to the region directly below the outer edge of the semiconductor chip.

According to the semiconductor device in which plural semiconductor chips are mounted to the surface of a wiring board, wiring led out from a given semiconductor chip is often applied in a wiring layout running below another semiconductor chip. In such cases, the wiring passes through the region directly below the outer edge of the semiconductor chip where stress is concentrated, and thus, measures to prevent the wiring from being disconnected are required.

SUMMARY

The present disclosure reduces the risk of disconnection of wiring in a semiconductor device including a wiring board having a free region where a mounting region of a semiconductor chip and a placement region of an external connection terminal such as a solder bump do not overlap.

A first aspect of the present disclosure is a semiconductor device including: a semiconductor chip; a substrate including a first region where the semiconductor chip is mounted and a second region separated from the first region; a conductive member provided at a second face of the substrate, the second face of the substrate is a face opposite to a first face to which the semiconductor chip is mounted; a protecting member, provided at the second face of the substrate to cover the conductive member, and including an opening partially exposing a portion of the conductive member placed at the second region; and an external connection terminal connected to the conductive member through the opening, wherein the protecting member contacts the substrate at a portion corresponding to an outer edge of the first region.

A second aspect of the present disclosure is semiconductor device including: a first semiconductor chip; a wiring board including a first face and a second face opposite to the first face, the first semiconductor chip being mounted at the first face side, and the wiring board including wiring in plural wiring layers that includes one wiring layer at the second face; and an external connection terminal connected to the wiring placed at the second face within a second region of the wiring board, the second region is separated from a first region of the wiring board where the first semiconductor chip is mounted, wherein the wiring board includes a first wiring that passes through a region corresponding to an outer edge of the first semiconductor chip, and a portion of the first wiring that extends into the region corresponding to the outer edge of the first semiconductor chip is provided in a wiring layer of the plural wiring layers other than the wiring layer on the second face.

A third aspect of the present disclosure is a design method for a wiring board including a first face, a second face opposite to the first face, a semiconductor chip mounted to the first face, an external connection terminal provided at the second face, and plural wiring layers that includes one wiring layer on the second face, the design method including: a first step of establishing a chip mounting region where the semiconductor chip mounted; a second step of establishing a placement region for the external connection terminal within a region separated from the chip mounting region; a third step of establishing a region corresponding to an outer edge of the chip mounting region as a specific region; and a fourth step of placing wiring in each of the plural wiring layers, wherein, in the fourth step, out of wiring that passes through the specific region, a portion that extends into the specific region is placed in a wiring layer out of the plural wiring layers other than the wiring layer on the second face.

According to the above aspects of the present disclosure, the risk of disconnection of wiring in a semiconductor device including a wiring board having a free region where a mounting region of a semiconductor chip and a placement region of an external connection terminal such as a solder bump do not overlap, may be reduced.

BRIEF DESCRIPTION OF THE DRAWINGS

Exemplary embodiments will be described in detail based on the following figures, wherein:

FIG. 2A is a cross-sectional view taken along line 2-2 in FIG. 1;

FIG. 2C is a cross-sectional view of a semiconductor device according to an exemplary embodiment of the present disclosure in a state of mounting to the mounting board;

DETAILED DESCRIPTION

Figure 1:
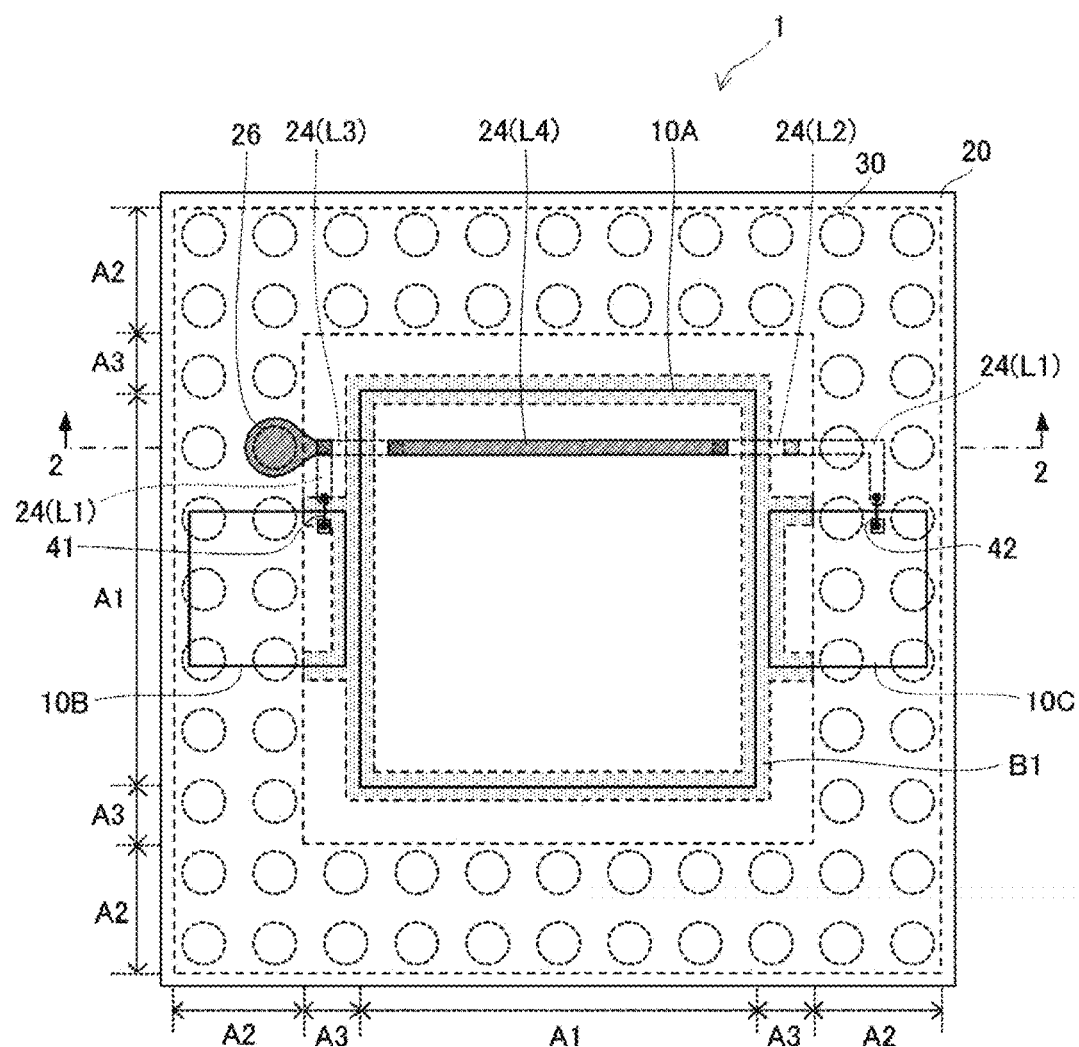
FIG. 1 is a transparent plan view illustrating a configuration of a semiconductor device according to an exemplary embodiment of the present disclosure.

An example of an exemplary embodiment of the present disclosure is described below, with reference to the drawings. Note that identical or equivalent configuration elements and sections are allocated the same reference numerals in each of the drawings.

FIG. 1 is a transparent plan view illustrating a configuration of a semiconductor device 1 according to an exemplary embodiment of the present disclosure, and FIG. 2A is a cross-sectional view taken along line 2-2 in FIG. 1.

Figure 2B:
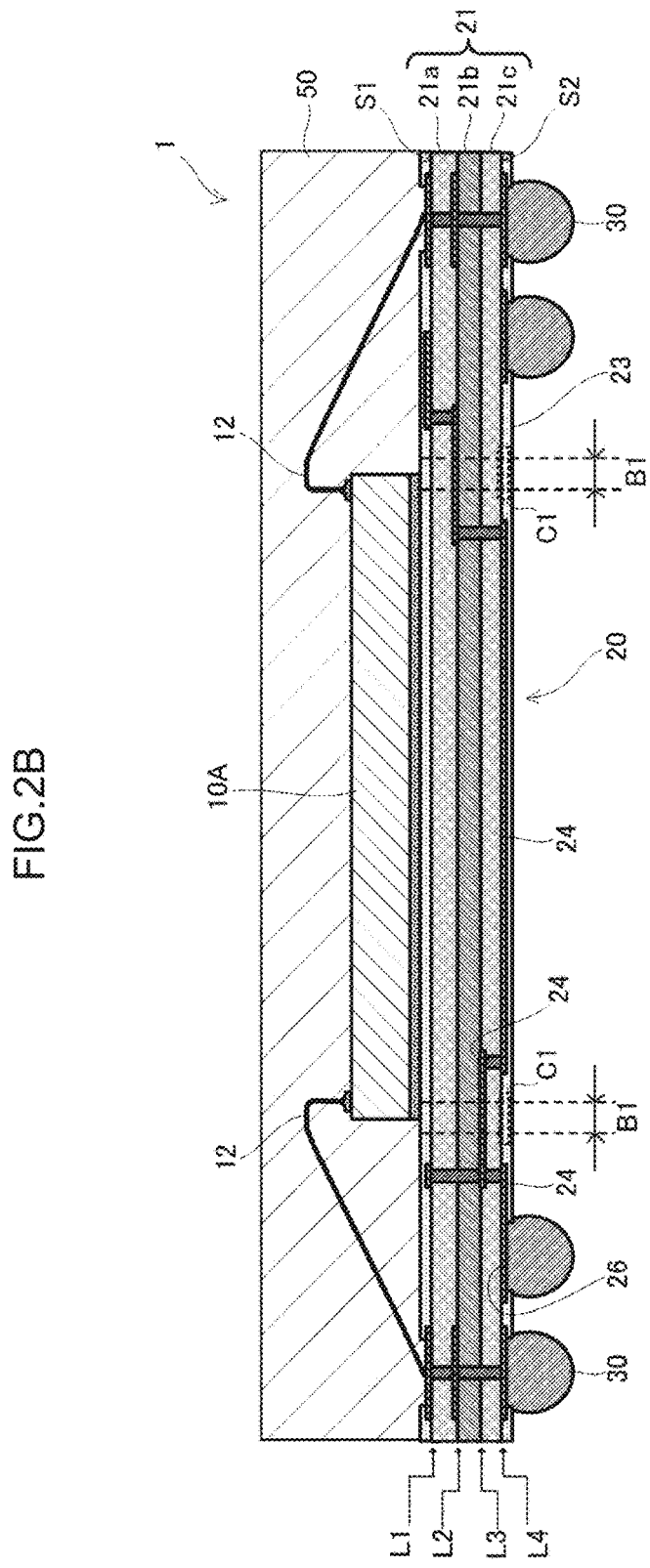
FIG. 2B is a cross-sectional view illustrating a configuration of a semiconductor device according to an exemplary embodiment of the present disclosure.

The semiconductor device 1 is configured including a wiring board 20, a first semiconductor chip 10A, a second semiconductor chip 10B, and a third semiconductor chip 10C mounted to a first face S1 side of the wiring board 20. The wiring board 20 functions as an interposer that provides electrical connections between a mounting board (not illustrated) to which the semiconductor device 1 is mounted, and the first semiconductor chip 10A, the second semiconductor chip 10B, and the third semiconductor chip 10C. As illustrated in FIG. 2B, the semiconductor device 1 may further include a sealing resin 50 provided on the first face S1 side of the wiring board 20. In this case, the first semiconductor chip 10A, the second semiconductor chip 10B, the third semiconductor chip 10C, and wires 12, 41, and 42 connecting the wiring board 20 to each of these semiconductor chips are embedded in the sealing resin 50.

As an example, the wiring board 20 includes a substrate 21 configured by respectively stacking prepregs 21a and 21c onto the two faces of a core member 21b configured by an insulator such as glass epoxy resin; and wiring layers L1 to L4 provided to the surface of and inside the substrate 21. In the wiring board 20, an upper face of the prepreg 21a is the first wiring layer L1, an upper face and a lower face of the core member 21b are the second wiring layer L2 and the third wiring layer L3, respectively, and a lower face of the prepreg 21c is the fourth wiring layer L4. Each of these wiring layers is, for example, provided with wiring configured by a conductive member such as copper foil. Connections between wiring across wiring layers are made using vias 25.

The wiring board 20 includes a solder resist 22 covering the first face S1, which is the upper face of the substrate 21. The wiring placed in the first wiring layer L1 is covered by the solder resist 22. Namely, the solder resist 22 functions as a protecting member that protects wiring placed in the first wiring layer L1, which is outer-layer wiring. The substrate 21 is in contact with the solder resist 22 at portions of the first wiring layer L1 where wiring is not formed.

Further, the wiring board 20 includes a solder resist 23 that covers a second face S2, which is a lower face of the substrate 21. The wiring placed in the fourth wiring layer L4 is covered by the solder resist 23. Namely, the solder resist 23 functions as a protecting member that protects the wiring placed in the fourth wiring layer L4, which is outer-layer wiring. The substrate 21 is in contact with the solder resist 23 in portions of the fourth wiring layer L4 where wiring is not formed.

The first semiconductor chip 10A, the second semiconductor chip 10B, and the third semiconductor chip 10C are each provided on the first face S1 side of the wiring board 20. The first semiconductor chip 10A, the second semiconductor chip 10B, and the third semiconductor chip 10C are joined to the wiring board 20 by a die attach member 11 provided to the surface of the solder resist 22. For example, a silver paste, an anisotropic conductive adhesive film, a die attach film, or the like may be employed as the die attach member 11.

In the present exemplary embodiment, the outlines of the main faces of the first semiconductor chip 10A, the second semiconductor chip 10B, and the third semiconductor chip 10C each form a square shape, and the size of the first semiconductor chip 10A is greater than sizes of the second semiconductor chip 10B and the third semiconductor chip 10C. The second semiconductor chip 10B and the third semiconductor chip 10C are semiconductor chips of the same type having the same functionality as each other, and are the same size as each other.

The first semiconductor chip 10A is placed in the center of the wiring board 20. In the wiring board 20, the mounting region of the first semiconductor chip 10A is a first region A1. Namely, the first region A1 of the wiring board 20 is a region supported by the first semiconductor chip 10A. The second semiconductor chip 10B and the third semiconductor chip 10C are provided outside of the first region A1 of the wiring board 20, and are placed to the left and right of the first semiconductor chip 10A such that the first semiconductor chip 10A is interposed therebetween.

As illustrated in FIG. 2A, the first semiconductor chip 10A is electrically connected to the wiring placed in the first wiring layer L1 of the wiring board 20 by the wire 12. The solder resist 22 includes an opening that exposes a portion of the wiring placed in the first wiring layer L1, this portion being where the wire 12 is connected.

As illustrated in FIG. 1, the second semiconductor chip 10B and the third semiconductor chip 10C are electrically connected to the wiring placed in the first wiring layer L1 of the wiring board 20 by the wires 41 and 42, respectively. The solder resist 22 includes openings that expose portions of the wiring placed in the first wiring layer L1, these portions being where the wires 41 and 42 connect.

Plural solder bumps 30 that function as external connection terminals are provided to the second face S2 side of the wiring board 20. The solder bumps 30 are connected to land portions 26, which are portions of wiring placed in the fourth wiring layer L4 of the wiring board 20. The solder resist 23 includes openings that expose the land portions 26 placed in the fourth wiring layer L4. The plural solder bumps 30 are provided to an outer peripheral region of the wiring board 20. Namely, the plural solder bumps 30 are provided so as to surround the outer periphery of the first semiconductor chip 10A. In the wiring board 20, a region where the plural solder bumps 30 are placed is a second region A2. Namely, the second region A2 of the wiring board 20 is a region supported by the plural solder bumps 30. The semiconductor device 1 in a state of being built into a final product is mounted on a mounting board 60, as illustrated in FIG. 2C. The mounting board 60 includes plural electrodes 61 that respectively correspond to the plural solder bumps 30. Joining each of the solder bumps 30 to the plural electrodes 61 fixes the semiconductor device 1 onto the mounting board 60. Namely, the second region A2 of the wiring board 20 is a region supported by the plural solder bumps 30 joined to the mounting board 60.

In the wiring board 20, the second region A2, this being the placement region of the solder bumps 30, does not overlap with the first region A1, this being the mounting region of the first semiconductor chip 10A. Namely, the second region A2 is separated from the first region A1 with a gap therebetween. Between the first region A1 and the second region A2, the wiring board 20 includes a free region that is supported by neither the first semiconductor chip 10A nor the solder bumps 30. Hereinafter, the free region is denoted as a third region A3.

Figure 3:
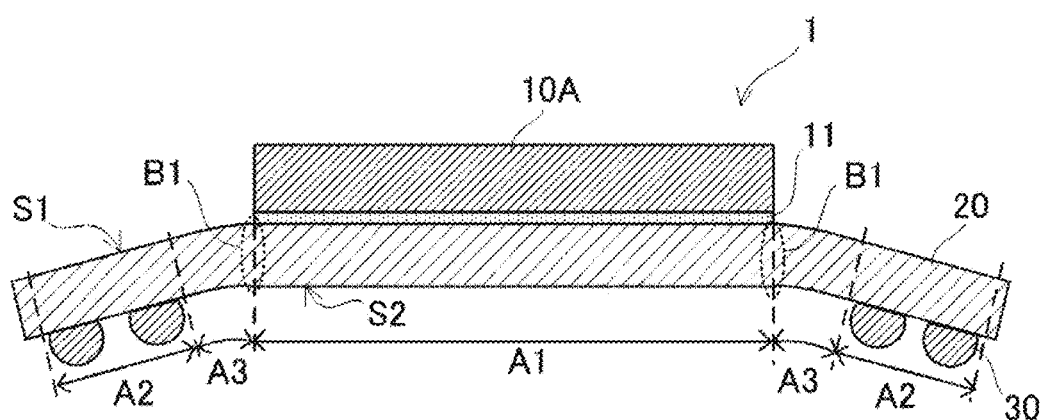
FIG. 3 is a diagram illustrating a state in which deflection occurs in the wiring board in a semiconductor device according to an exemplary embodiment of the present disclosure.

In a case in which thermal stress is applied to the semiconductor device 1 provided with the wiring board 20 that includes the free region, as illustrated in FIG. 3, the wiring board 20 deflections (bends) originating from the third region A3 (the free region). Deflection of the wiring board 20 due thermal stress occurs since the thermal expansion coefficient of the wiring board 20 is greater than the thermal expansion coefficients of the first semiconductor chip 10A and the die attach member 11.

Stress generated in the wiring board 20 as a result of deflection of the wiring board 20 is concentrated in a region directly below the outer edges of the first semiconductor chip 10A, the second semiconductor chip 10B, and the third semiconductor chip 10C. Hereafter, this region is denoted the stress-concentration region B1. The stress-concentration region B1 is, among plural regions that span a predetermined range toward outside and inside from projection lines of the outer edge of each the semiconductor chips, a region other than the second region A2 (the placement region of the solder bumps 30). Out of the plural wiring layers, the stress in the stress-concentration region B1 is especially great in the fourth wiring layer L4, which is at the second face S2 and is furthest from the first face S1 (the chip mounting face). This is because the first face S1 side of the wiring board 20 is mounted with the semiconductor chip and the stress caused by deflection is comparatively small since there is a supporting force imparted by the semiconductor chip. The second face S2 side, however, is not easily imparted with a supporting force by the semiconductor chip and so stress caused by deflection is comparatively great. Accordingly, there is a high risk of disconnections occurring in the wiring in portions that extend into the stress-concentration region B1, in cases in which the wiring placed at the fourth wiring layer L4 passes through the stress-concentration region B1.

In the wiring board 20 according to the present exemplary embodiment, regions extending into the stress-concentration region B1 of the fourth wiring layer L4 are wiring placement forbidden regions C1. Namely, out of the wiring provided to the wiring board 20, in the wiring that passes through the stress-concentration region B1, portions of the wiring that extend into the stress-concentration region B1 are placed in wiring layers other than the fourth wiring layer L4 (either the first wiring layer L1, the second wiring layer L2, or the third wiring layer L3). In other words, wiring is not placed in portions of the fourth wiring layer L4 that extend into the stress-concentration region B1, and the substrate 21 of the wiring board 20 is in contact with the solder resist 23 in these portions. Thus, out of wiring that passes through the stress-concentration region B1, portions that extend into the stress-concentration region B1 are placed in wiring layers other than the fourth wiring layer L4. Accordingly, the wiring board 20 according to the present exemplary embodiment may reduce the risk of disconnections occurring in the wiring, in cases in which thermal stress is applied.

In FIG. 1 and FIG. 2A to FIG. 2C, connection wiring 24 connected to both the second semiconductor chip 10B and the third semiconductor chip 10C is illustrated as an example of wiring that passes through a stress-concentration region B1. One end of the connection wiring 24 branches between the fourth wiring layer L4 and the first wiring layer L1, a portion of the connection wiring 24 placed in the fourth wiring layer L4 is connected to a solder bump 30 via a land portion 26, and a portion of the connection wiring 24 placed in the first wiring layer L1 is connected to the second semiconductor chip 10B via the wire 41. Another end of the connection wiring 24 is placed in the first wiring layer L1 and is connected to the third semiconductor chip 10C via the wire 42. The connection wiring 24 is laid out from one end to another end so as to pass under the first semiconductor chip 10A. Namely, the connection wiring 24 passes through a region directly below the outer edge of the first semiconductor chip 10A, this being a stress-concentration region B1. The connection wiring 24 is provided such that the portion extending into the stress-concentration region B1 detours to a wiring layer other than the fourth wiring layer L4. In the example illustrated in FIGS. 2A-2C, the portions of the connection wiring 24 extending into the stress-concentration region B1 are placed in the third wiring layer L3 and the second wiring layer L2.

Figure 4:
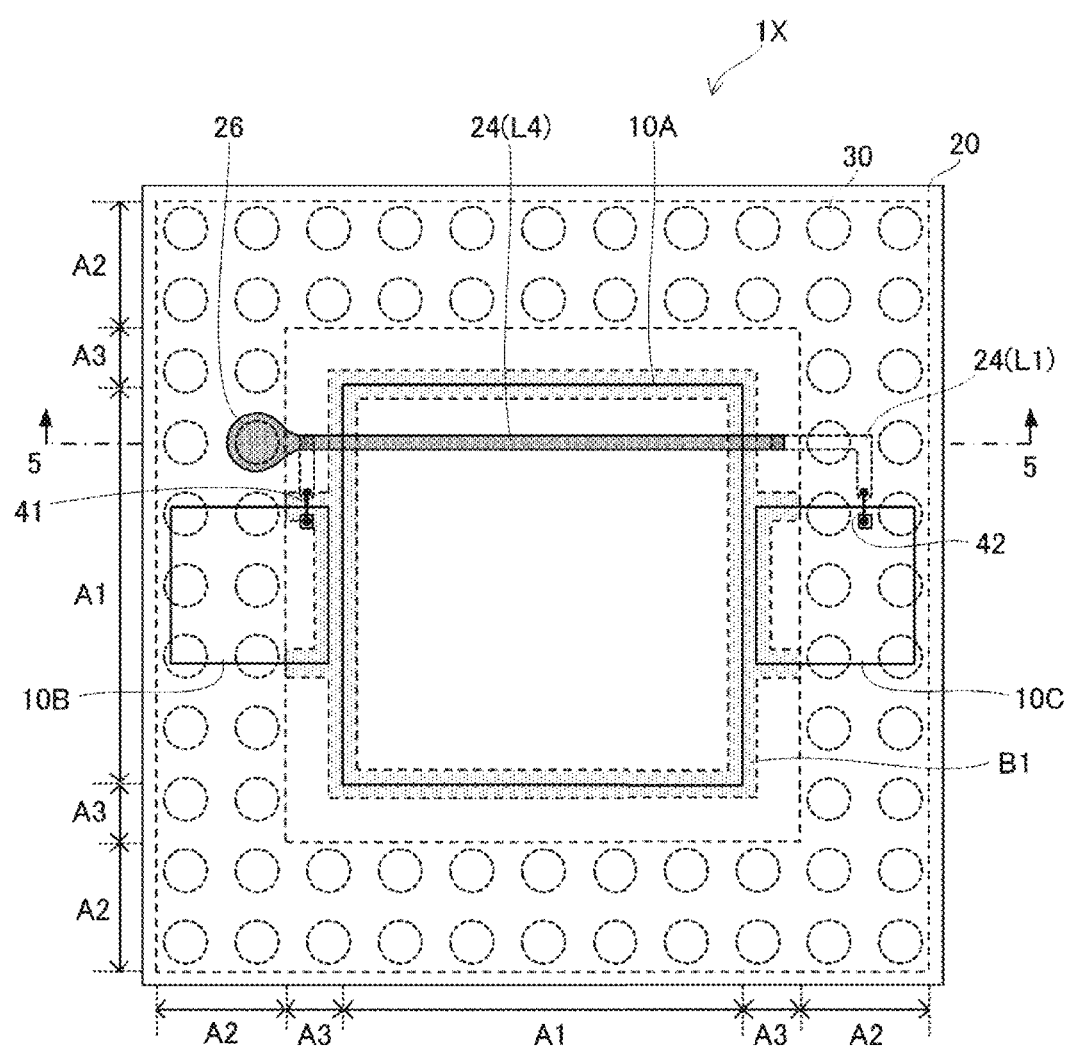
FIG. 4 is a transparent plan view illustrating a configuration of a semiconductor device according to a comparative example.
Figure 5:
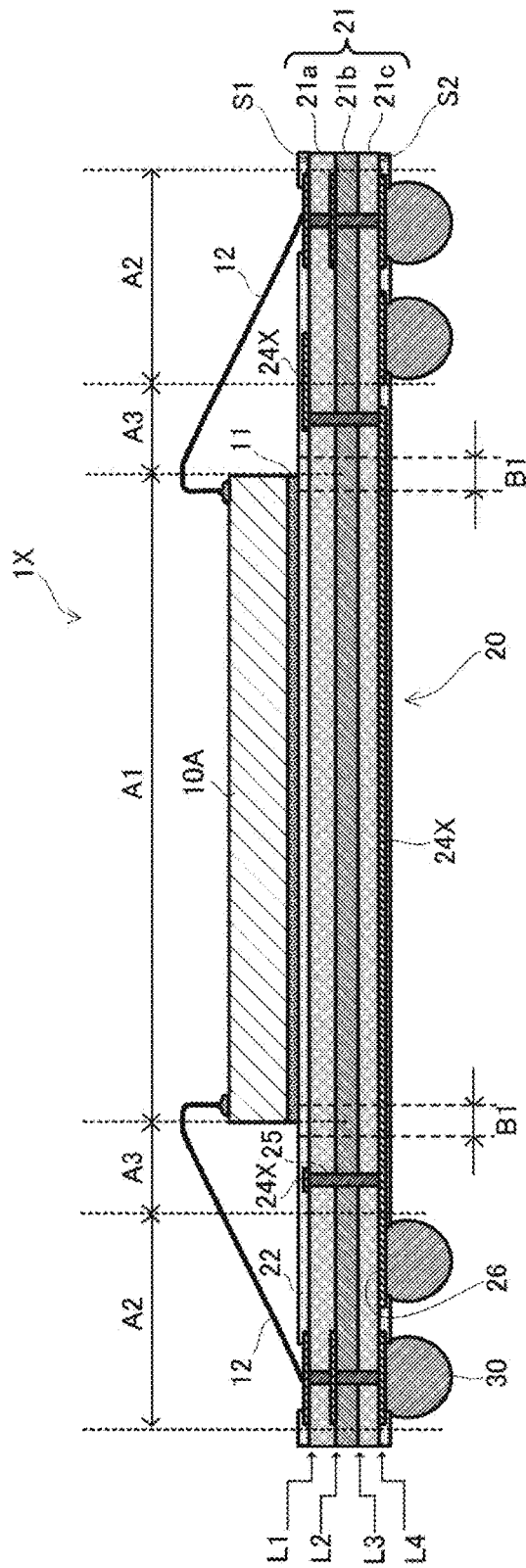
FIG. 5 is a cross-sectional view taken along line 5-5 in FIG. 4.

FIG. 4 is a transparent plan view illustrating a configuration of a semiconductor device 1X according to a comparative example, and FIG. 5 is a cross-sectional view thereof taken along line 5-5 of FIG. 4. In the semiconductor device 1X according to the comparative example, placement of connection wiring 24X is different from the placement of the connection wiring 24 in the semiconductor device 1 according to the exemplary embodiment of the present disclosure. Similarly to the connection wiring 24, the connection wiring 24X is wiring connected to both the second semiconductor chip 10B and the third semiconductor chip 10C, and is wiring that passes through the stress-concentration region B1.

A portion of the connection wiring 24X according to the comparative example that extends into the stress-concentration region B1 is placed in the fourth wiring layer L4. As described above, out of the plural wiring layers, the stress in the stress-concentration region B1 is especially great in the fourth wiring layer L4, and the risk of a break occurring in this portion is high, in a case in which a portion of the connection wiring 24X extending into the stress-concentration region B1 is placed in the fourth wiring layer LA. On the other hand, according to the semiconductor device 1 according to the exemplary embodiment of the present disclosure, the portion of the connection wiring 24 that extends into the stress-concentration region B1 is provided so as to detour to a wiring layer other than the fourth wiring layer L4, enabling a reduction in the risk of a break occurring in the connection wiring 24 when thermal stress is applied.

Figure 6:
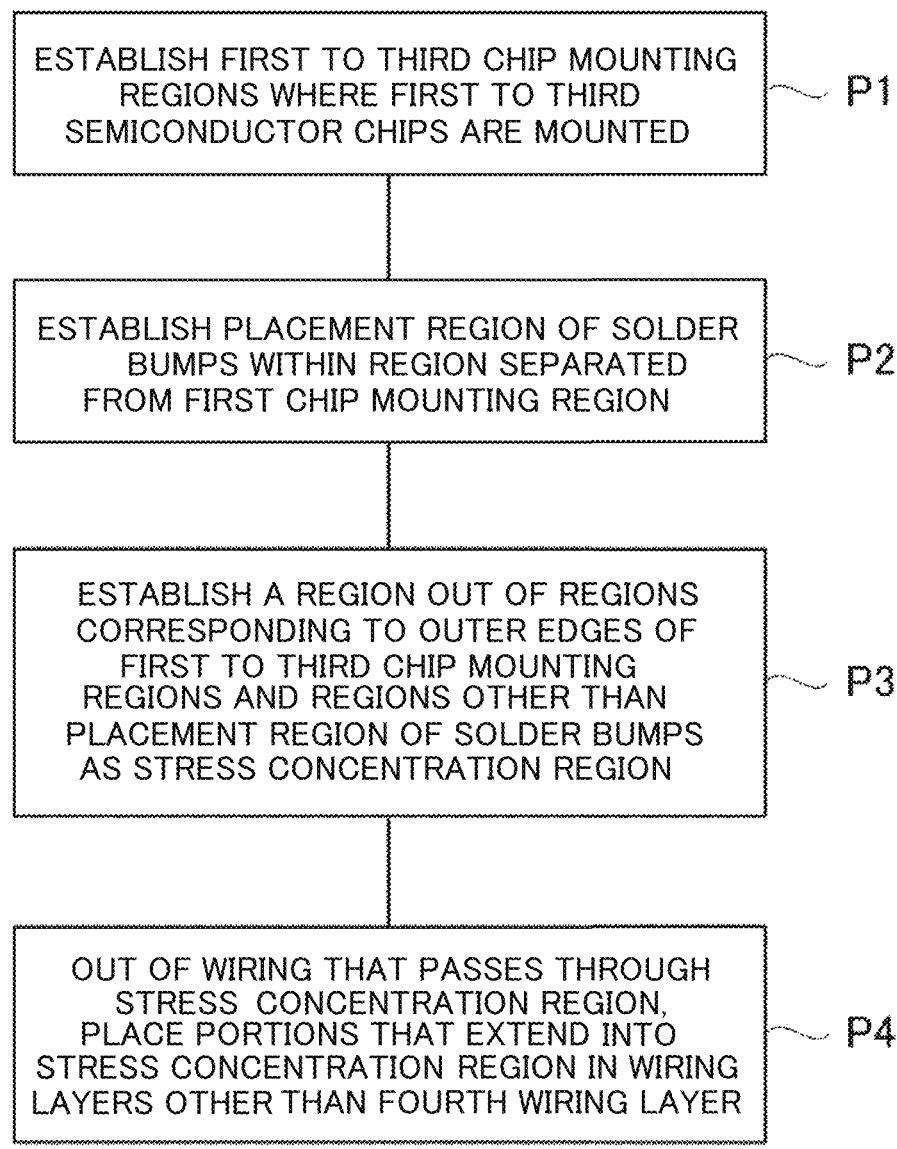
FIG. 6 is a flowchart illustrating a design procedure for a wiring board according to an exemplary embodiment of the present disclosure.

A design method for the wiring board 20 is described below. FIG. 6 is a design flowchart illustrating an example of a design procedure for the wiring board 20.

In step P1, a first chip mounting region, a second chip mounting region, and a third chip mounting region mounted with the first semiconductor chip 10A, the second semiconductor chip 10B, and the third semiconductor chip 10C, respectively, are established. The second chip mounting region and the third chip mounting region are placed at the outside of the first region A1, this being the first chip mounting region.

In step P2, the placement region of the solder bumps 30 is established within a region separated from the first chip mounting region. Namely, the placement region of the solder bumps 30 is established within the second region A2, which is a region separated from the first region A1.

In step P3, among plural regions spanning a predetermined range toward outside and inside from projection lines of the outer edges of the first chip mounting region, the second chip mounting region and the third chip mounting region, and a region other than the second region A2, which is the placement region of the solder bumps 30, is established as the stress-concentration region B1.

In step P4, wiring is placed in the first wiring layer L1 to the fourth wiring layer L4. For wiring that passes through the stress-concentration region B1 established in step P3, portions of the wiring extending into the stress-concentration region B1 are placed in wiring layers other than the fourth wiring layer L4.

Accordingly, the semiconductor device 1 and the design method for a wiring board according to the exemplary embodiment of the present disclosure may reduce the risk of a break occurring in wiring in a semiconductor device that includes a wiring board on which semiconductor chip mounting regions and placement regions of external connection terminals such as solder bumps do not overlap, such that there are free regions.

Note that, in the present exemplary embodiment, although an example has been given a case in which the wiring board 20 includes four wiring layers, the number of wiring layers can be modified as appropriate.

Further, in the present exemplary embodiment, although an example has been given a case in which plural semiconductor chips are mounted on the wiring board 20, the present disclosure can also be applied to configurations in which a single semiconductor chip is mounted on the wiring board.

Further, in the present exemplary embodiment, an example has been given a case in which the wiring placement forbidden region C1 is set for the fourth wiring layer L4 only. However, there may be a case in which a high risk of a disconnection occurring in the stress-concentration region B1 in the third wiring layer L3 and the second wiring layer L2. In such case, regions of the third wiring layer L3 and the second wiring layer L2 that extend into the stress-concentration region B1 may also be set as wiring placement forbidden regions C1, rather than just the fourth wiring layer L4.

What is claimed is:
1. A semiconductor device comprising:
a semiconductor chip;
a substrate including a first region where the semiconductor chip is mounted and a second region separated from the first region;
a plurality of conductive members provided at a portion corresponding to the first region at a second face of the substrate and at a portion corresponding to the second region at the second face of the substrate, respectively, the second face of the substrate is a face opposite to a first face to which the semiconductor chip is mounted;
a protecting member, provided at the second face of the substrate to cover the plurality of conductive members, and including an opening partially exposing the plurality of conductive members placed at the second region; and
an external connection terminal connected to one or more of the plurality of conductive members through the opening,
wherein the protecting member contacts the substrate at a portion corresponding to an outer edge of the first region at the second face of the substrate.

2. The semiconductor device of claim 1, wherein a second semiconductor chip different from the semiconductor chip is mounted on the first face of the substrate at a region different from the first region.

3. The semiconductor device of claim 1, wherein the protecting member includes the opening only at a region that corresponds to the second region.

4. The semiconductor device of claim 1, wherein the plurality of conductive members comprise:
- a first conductive member, formed at the second face of the substrate in the second region, and connected to the external connection terminal; and
- a second conductive member, formed at the second face of the substrate in the first region, and electrically connected to the first conductive member.

5. The semiconductor device of claim 2, wherein the protecting member includes the opening only at a region that corresponds to the second region.

6. A design method for a wiring board including a first face, a second face opposite to the first face, a semiconductor chip mounted to the first face, an external connection terminal provided at the second face, and a plurality wiring layers that includes one wiring layer on the second face, the design method comprising:
- a first step of establishing a chip mounting region where the semiconductor chip is mounted;
- a second step of establishing a placement region for the external connection terminal within a region separated from the chip mounting region;
- a third step of establishing a region corresponding to an outer edge of the chip mounting region as a specific region; and
- a fourth step of placing wiring in each of the plurality of wiring layers,
- wherein, in the fourth step, a wiring among the plurality of wiring layers includes a portion that extends across the chip mounting region and that is in a wiring layer among the wiring layers that is disposed at the second face, and another portion that passes through the specific region and is placed in a wiring layer of the plurality of wiring layers other than the wiring layer on the second face.

7. The design method of claim 6, wherein
- in the first step, a plurality of chip mounting regions are established as where a plurality respective semiconductor chips are mounted; and
- in the third step, out of regions that correspond to an outer edge of each of the plurality of chip mounting regions, a region other than the placement region of the external connection terminal is established as the specific region.

* * * * *